(12) United States Patent
Zoestbergen et al.

(10) Patent No.: US 10,131,983 B2
(45) Date of Patent: Nov. 20, 2018

(54) METHOD AND APPARATUS FOR CONTROLLING THE COMPOSITION OF LIQUID METAL IN AN EVAPORATOR DEVICE

(71) Applicant: TATA STEEL NEDERLAND TECHNOLOGY B.V., Velsen-Noord (NL)

(72) Inventors: Edzo Zoestbergen, Alkmaar (NL); Jörgen van de Langkruis, Amsterdam (NL); Theodorus Franciscus Jozef Maalman, Uitgeest (NL)

(73) Assignee: TATA STEEL NEDERLAND TECHNOLOGY B.V., Velsen-Noord (NL)

( * ) Notice: Subject to any disclaimer, the term of this patent is extended or adjusted under 35 U.S.C. 154(b) by 260 days.

(21) Appl. No.: 15/032,572

(22) PCT Filed: Nov. 5, 2014

(86) PCT No.: PCT/EP2014/073825
§ 371 (c)(1),
(2) Date: Apr. 27, 2016

(87) PCT Pub. No.: WO2015/067662
PCT Pub. Date: May 14, 2015

(65) Prior Publication Data
US 2016/0265102 A1    Sep. 15, 2016

(30) Foreign Application Priority Data
Nov. 5, 2013 (EP) .................................. 13005206

(51) Int. Cl.
*C23C 14/24* (2006.01)
*C23C 14/54* (2006.01)
(Continued)

(52) U.S. Cl.
CPC ............ *C23C 14/548* (2013.01); *C23C 14/14* (2013.01); *C23C 14/24* (2013.01); *C23C 14/246* (2013.01); *C23C 14/28* (2013.01)

(58) Field of Classification Search
CPC .............................. C23C 14/246; C23C 14/14
(Continued)

(56) References Cited

U.S. PATENT DOCUMENTS

2010/0104752 A1*  4/2010  Choquet ................. C23C 14/16
                                                            427/250
2011/0000431 A1*  1/2011  Banaszak ................ C23C 14/16
                                                            118/694
(Continued)

FOREIGN PATENT DOCUMENTS

KR       20110034420 A     4/2011
WO       2005116290 A1    12/2005

OTHER PUBLICATIONS

International Search Report and Written Opinion dated Jan. 19, 2015 for PCT/EP2014/073825 to Tata Steel Ijmuiden B.V. filed Nov. 5, 2014.

*Primary Examiner* — Elizabeth A Burkhart
(74) *Attorney, Agent, or Firm* — Vorys, Sater, Seymour and Pease LLP

(57) ABSTRACT

An apparatus and method for controlling the composition of liquid metal fed to an evaporator in a vacuum chamber used in a physical vapor deposition process.

24 Claims, 2 Drawing Sheets

(51) Int. Cl.
*C23C 14/14* (2006.01)
*C23C 14/28* (2006.01)

(58) Field of Classification Search
USPC .......................................................... 118/726
See application file for complete search history.

(56) References Cited

U.S. PATENT DOCUMENTS

2011/0195187 A1* 8/2011 Weber ..................... C23C 14/12
427/248.1
2011/0281031 A1 11/2011 Silberberg et al.

* cited by examiner

METHOD AND APPARATUS FOR CONTROLLING THE COMPOSITION OF LIQUID METAL IN AN EVAPORATOR DEVICE

CROSS-REFERENCE TO RELATED APPLICATIONS

This is a § 371 US National Stage Application of International Application No. PCT/EP2014/073825 filed on Nov. 5, 2014, claiming the priority of European Patent Application No. 13005206.1 filed on Nov. 5, 2013.

FIELD OF THE INVENTION

The invention relates to an apparatus and method to feed liquid metal composed of two or more metals to an evaporator in a vacuum chamber. Such an evaporator is for instance used in a physical vapour deposition (PVD) process wherein a metal vapour is deposited on a substrate such as a steel strip.

BACKGROUND OF THE INVENTION

In PVD processes and more in particular in continuous or semi-continuous PVD processes on an industrial scale it is necessary to provide a stable supply of liquid metal to the evaporator device wherein the supply is in accordance with the liquid metal evaporated in the evaporator device. This is particularly demanding with high speed PVD processes such as the deposition of evaporated metal on steel strip.

Moreover, with a liquid metal composed of two or more metals with different vapour pressures, the metal or metals with the higher vapour pressure will evaporate at a higher rate than the metal or metals with a lower vapour pressure. As a result of that the composition of the liquid metal in the evaporator will change over time. Since the metals used in the composition of the liquid metal will almost never be 100% pure this will result in that the composition will be enriched with impurities with a lower vapour pressure.

Both the change in composition of the melt and the enrichment of the melt with impurities will have a negative result on the composition of the vapour and hence on the coating deposited on the substrate, as well as on the evaporation process as such.

The problem of impurities could possibly be addressed by using high purity feeding material but this will increase costs considerably and is not really an option if the PVD process is run on an industrial scale.

The change of the composition of the liquid metal could be controlled to a certain extent by increasing the size of the evaporator but this will increase the space needed for the evaporator in the vacuum chamber and eliminates one of the advantages of using induction heating which is having a high power input into a limited space. An alternative is to feed the evaporator from an external source of liquid metal as is disclosed in KR20110034420, which however suffers from the same problem only it will take some more time for the composition to change to an unacceptable level of deviation from the required composition.

OBJECTIVES OF THE INVENTION

It is an objective of the present invention to provide an apparatus which allows control of the composition of the metal vapour resulting from the evaporation process in the evaporator.

It is another objective of the present invention to provide an apparatus which allows control of the composition of the liquid metal in the evaporator.

It is another objective of the present invention to provide an apparatus which allows rapid change of the composition of the liquid metal in the evaporator.

It is still another objective of the present invention to provide a method to control the composition of a liquid metal in an evaporator device in a vacuum chamber.

DESCRIPTION OF THE INVENTION

According to a first aspect of the invention one or more of the objectives of the invention are realized by providing an apparatus for controlling the composition of a liquid metal in an evaporator device in a vacuum chamber, wherein the liquid metal comprises two or more metals, the apparatus comprising a first and a second vessel for containing liquid metal, means to feed the liquid metal from the first vessel to the evaporator and means to feed the liquid metal from the second vessel to the liquid metal of the first vessel or to the evaporator. In the apparatus according the invention the liquid metal from the second vessel is used to compensate for changes in the composition of the liquid metal in the evaporator caused by differences in evaporating rates of the metals constituting the liquid metal because of different vapour pressures.

It is further provided that the means to feed the liquid metal from the first vessel to the evaporator comprises a supply line provided with a magnetohydrodynamic (MHD) pump. Such a MHD pump allows pumping of the liquid metal in both directions which allows keeping the level in the evaporator at a desired level or within a narrow range around a certain level.

According to a further aspect of the invention the means to feed the liquid metal from the first vessel to the evaporator comprises a return line provided with a MHD pump. With this arrangement it is possible to circulate the liquid metal and to control the composition of the liquid metal in the evaporator up to a certain extent. This will not prevent that in time the composition will change due to different evaporation rates of the metals constituting the liquid metal as initially contained in the first vessel. It is further provided that the means to feed the liquid metal from the second vessel comprises a feed line provided with a magnetohydrodynamic pump. This allows supplying liquid metal from the second vessel at a controlled flow with the possibility to compensate for pressure differences in the feed system.

According to another aspect of the invention the feed line of the second vessel connects directly to the evaporator or to the supply line of the first vessel. Connecting directly to the evaporator has the advantage of allowing an almost instantaneous control of the composition of the liquid metal in the evaporator, however the disadvantage is that another feed line has to pass through the wall of the vacuum chamber. Connecting the feed line of the second vessel to the supply line of the first vessel prevents the disadvantage of another passage through the wall of the vacuum chamber while the supply of liquid metal from the second vessel is almost as good as feeding directly to the evaporator.

In order to control the liquid metal supply to the evaporator level sensors are provided for the first and second vessel and the evaporator to monitor and control the levels of liquid metal therein.

In order to be able to further control the liquid metal flow meters are provided in the supply line, the feed line and the return line.

Further valves are provided in supply line, feed line and the return line which allow to close supply, feed and return lines in the control of the supply of liquid metal to the evaporator.

The evaporator is provided with induction heating means which besides heating and evaporating the liquid metal in the evaporator also provide that the liquid metal is well stirred in the evaporator therewith mixing liquid metal fed from the first and second vessel to a homogeneous composition.

In order to prevent solidification of liquid metal anywhere in the system heating means are provided to heat the supply line, the feed line, the return line, the valves, the magnetohydrodynamic pumps and the first and second vessel.

The invention also provides in a method to control the composition of a liquid metal in an evaporator device in a vacuum chamber, wherein the liquid metal comprises two or more metals, the method comprising the steps of
  supplying a liquid metal of a first composition in a first vessel for a liquid metal,
  supplying a liquid metal of a second composition in a second vessel for a liquid metal,
  feeding the liquid metal of the second composition to the liquid metal of the first vessel or to the evaporator, wherein the composition of the liquid metal in the second vessel is chosen to control the composition of the liquid metal in the evaporator.

According to a further aspect of the invention the composition of the liquid metal in the second vessel is chosen to compensate for the evaporation of the metals from the evaporator. In order to compensate for such evaporation the composition of the liquid metal in the second vessel corresponds to a predetermined vapour composition. The initial composition of the liquid metal in the first vessel is such that the resulting vapour corresponds to the required vapour composition and therewith to the required composition of the metal coating on the substrate. Because of different evaporation rates of the metals constituting the liquid metal the composition of the liquid metal in the evaporator and in time in the first vessel will change. By feeding liquid metal from the second vessel with a composition that corresponds to the evaporated metal and with an amount corresponding to the vaporizing rate, the required composition of the vapour and therewith that of the coating is maintained and the change in composition of the liquid metal from the first vessel is compensated.

The term "corresponds" as used in the description is to be understood that the composition is either identical to or is within a certain range about a predetermined composition. Due to almost inevitable variations in the process the composition will vary around a target composition which is acceptable as long as the variations are within a certain range.

In coating a substrate the composition of the applied coating is what matters most and "correspond" will mean that the composition in the evaporator, the composition in the second vessel and the control of the flow of liquid metal is, or is relative to each other, such that the composition of the evaporated metal and the applied coating will be identical to or within a certain range around the predetermined composition of the coating.

As an example, to generate a vapour with 10 wt % Mg and 90 wt % Zn the liquid metal in the evaporator must contain approximately 40 wt % magnesium and 60 wt % Zn and the composition of the liquid metal from the second vessel 9, the feeding pot must correspond to the composition of the vapour. For such a vapour composition and hence for the coating composition a range for Mg of 7.5 wt %-12.5 wt % could be acceptable but is preferably narrower, for instance 8 wt %-12 wt % or even more preferably 9 wt %-11 wt %.

With a target composition of 2 wt % Mg the acceptable range will preferably be narrower for instance 1.75 wt %-2.25 wt % and even more preferable 1.8 wt %-2.2 wt %.

With the above target compositions the deviation in both directions from the target value is not more than 25% and preferably not more than 10%. With target compositions wherein the amount of a component is in the range of for instance 30-50 wt % the allowable deviation from the target value will be less than in the foregoing examples and preferably 10% or less and even more preferably 5% or less.

According to still a further aspect of the invention it is provided that the composition of the liquid metal in the second vessel corresponds to a predetermined composition of liquid metal in the first vessel. In order to facilitate a quick change from a first coating composition to a second coating composition, the supply from the second vessel is stopped while the supply from the first vessel is continued. In the mean time the second vessel is at least partially refilled to get a liquid metal composition that corresponds to the second coating composition, after which the supply from the first vessel is stopped and the supply of the second vessel is opened.

The liquid metal in the first vessel is then changed to a liquid metal composition that corresponds to the second coating composition, after which the supply from the first vessel is opened and the supply from the second vessel is closed. The composition of the liquid metal in the second vessel is then changed to correspond to a composition needed to compensate for the change in composition through evaporation of the liquid metal fed from the first vessel.

Since the liquid metal in the second vessel is used to compensate for the change in composition through evaporation of the liquid metal fed from the first vessel and to temporarily take over the function of the first vessel the capacity of the second vessel can be smaller than that of the first vessel.

BRIEF DESCRIPTION OF THE DRAWINGS

The invention will be further explained on hand of the drawing, in which.

DETAILED DESCRIPTION OF THE DRAWINGS

Figure 1:
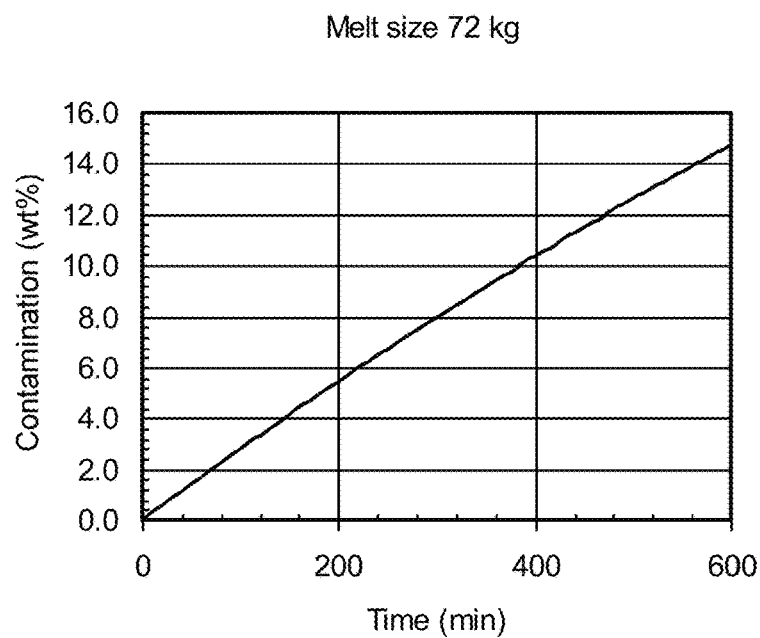
FIG. 1 shows a graph with the amount of constituents of low vapour pressure in the evaporator plotted against time.

The liquid material fed to an evaporator is never 100% pure and this means that especially on an industrial scale the evaporator will be enriched with constituents of a low vapour pressure. For an industrial line, running at 120 (m/min) with a strip width of 1500 mm depositing four microns of ZnMg on both sides from an evaporator containing 72 kilos and which is being feed with 99.5 weight % pure material, the constituent percentage is given in FIG. 1. After 10 hours of operation 14 wt % of the melt consists of a non-evaporating species.

Figure 2:
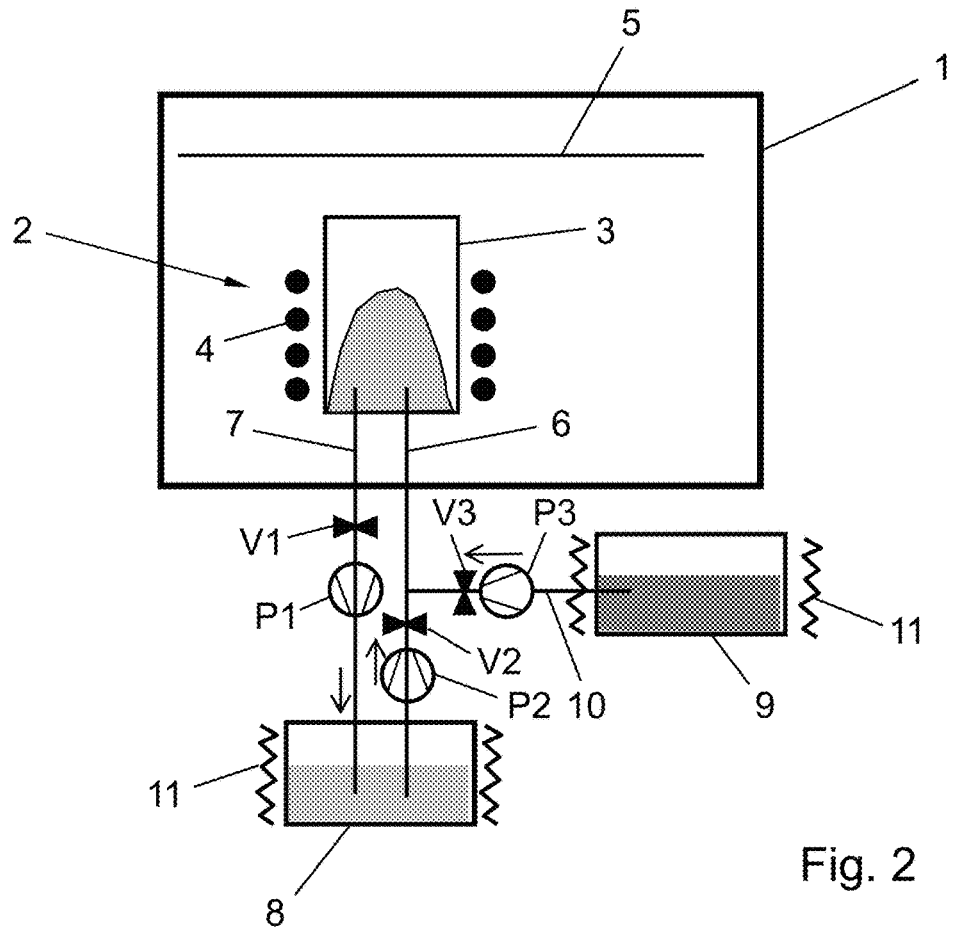
FIG. 2 shows a first embodiment with the feed line of the second vessel connected to the supply line of the first vessel.

FIG. 2 shows a first embodiment of the apparatus, wherein the apparatus comprises a vacuum chamber 1, an evaporator 2 with a crucible 3 for the liquid metal and an induction coil 4 to further heat and evaporate the liquid metal in the crucible. Above the evaporator passes a strip 5 through the vacuum chamber 1 on which the evaporated metal is applied as a coating. Connected to crucible 3 are a supply line 6 and a return line 7 for respectively the supply and return of liquid metal to and from the crucible. Supply line 6 and return line 7 are connected to a first vessel, melting pot 8, outside the vacuum chamber. A second vessel, feeding pot 9, is provided containing liquid metal connected by means of a feed line 10 to supply line 6. Melting pot 8 and feeding pot 9 are both provided with heating and insulating means 11 which are shown schematically in the drawing.

In the supply line 6, return line 7 and feed line 10 MHD pumps P1, P2 and P3 are provided as well as valves V1, V2 and V3.

In the apparatus according to FIG. 2 the liquid metal from the second vessel 9, the feeding pot, is injected outside the vacuum chamber into the supply line between the first vessel 8, the melting pot, and crucible 3. Only two lines are connected to the evaporator 2 through the wall of the vacuum chamber 1. Mixing of the liquid is assured because it is injected in the supply line 6 and due to the mixing in the evaporator 2. MHD pumps P1 and P2 are generating the same flow and the flow generated by MHD pump P3 is the same as the evaporation rate of the evaporator. The process control is conducted with contactless flow meters in all lines, level sensors in the vessels and the evaporator, the frequency of the induction heater of the evaporator using a Rogowski coil and the measurement of the composition and weight of the produced coating, using for example an X-ray fluorescence (XRF) spectrometer.

Due to the difference in vapour pressure of elements the evaporation rate of two elements making up a binary liquid metal is not equal to the composition of the resulting vapour or deposited coating. An example is ZnMg, for generating a vapour with 10 wt % Mg and 90 wt % Zn the liquid metal in the evaporator must contain approximately 40 wt % magnesium and 60 wt % Zn. This also means that to produce a coating with a constant composition it is important and necessary that the evaporated material is replenished in such a way that the composition of the liquid metal in the evaporator stays constant. To this aim the composition of the liquid metal from the second vessel 9, the feeding pot, must correspond to the composition of the evaporated material, so the metal liquid from the second vessel 9, the feeding pot, has a different composition than that of the liquid metal in the evaporator.

To assure that the feeding does not generate a composition gradient in the evaporator it is important that the liquid metal in the evaporator is stirred. This is taken care of by the induction heating system with induction coil 4 which will generate Lorentz forces in the liquid metal in the evaporator 2. These Lorentz forces will generate a violent stirring and assure a homogenous composition. The abovementioned example is for a binary alloy but it holds also for a ternary alloy or for an alloy where non-evaporating species are added to improve the stability and the evaporation rate of the evaporator.

This set-up also makes it possible to change the composition of the liquid metal in the evaporator and the produced coating composition. First valves V1 and V2 are closed. The evaporation is continued while feeding from the second vessel 9, the feeding pot, only and although this will result in an additional contamination of the evaporator liquid metal, the liquid metal composition in the evaporator can be kept about constant for a certain time. The composition in the first vessel 8, the melting pot, is changed online to the required composition. Valves V1 and V2 are opened and valve V3 is closed. Now the composition in the evaporator is changed due to the feeding from the first vessel 8, the melting pot. The MHD pumps P1 and P2 must have a mass flow difference which is the same as the evaporation rate. The evaporation is reducing the filling of the melting pot 8 and because the melting pot is much larger than the evaporator the composition will not change significantly in a short time. The second vessel 9, the feeding pot, is filled with the new coating composition and valve V3 is opened, and the operation can be continued with the new composition.

Figure 3:
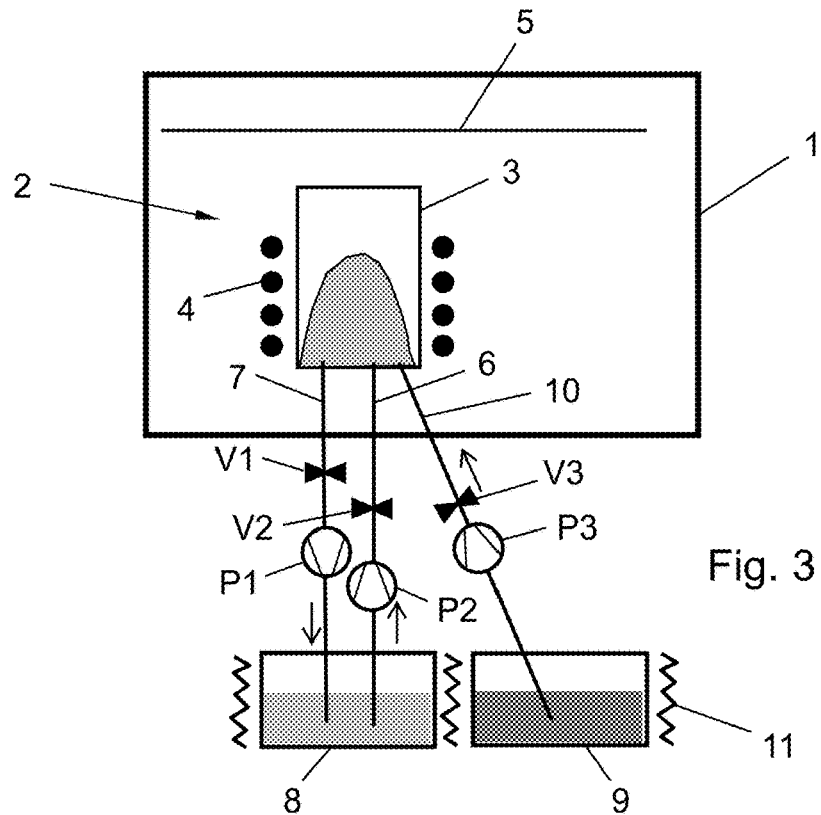
FIG. 3 shows a second embodiment with the feed line of the second vessel connected to the evaporator.

In FIG. 3 another embodiment is shown where the feed line from the second vessel 9, the feeding pot, connects directly to the evaporator. This embodiment has about the same performance as the first embodiment however, now three vacuum feed-through lines are required.

Figure 4:
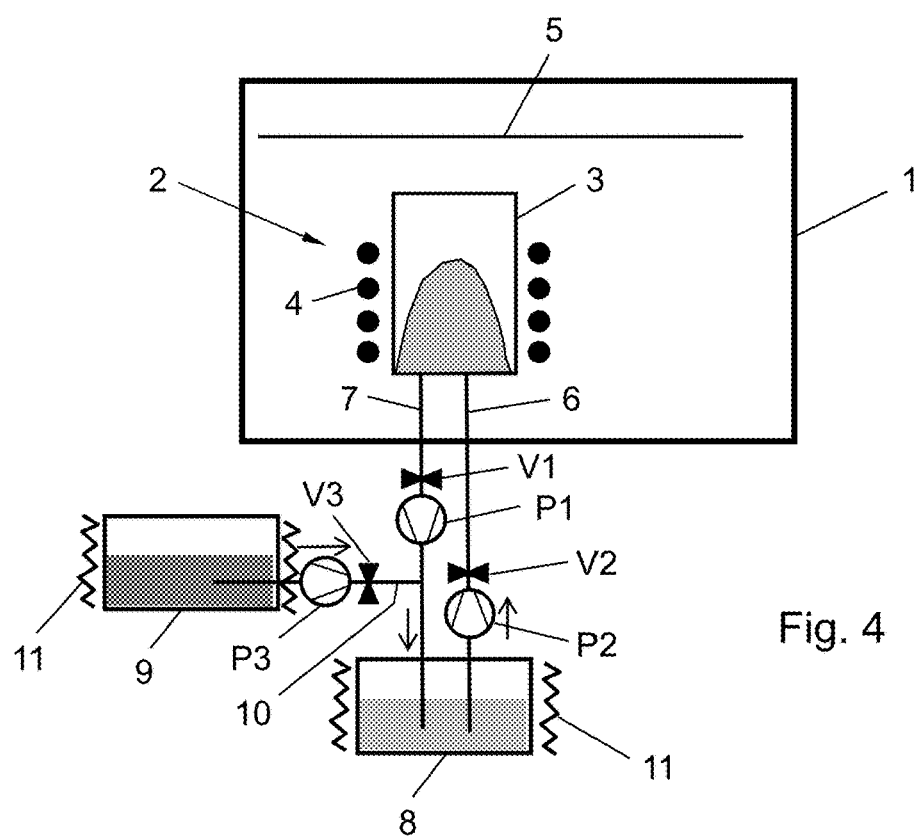
FIG. 4 shows a third embodiment with the feed line of the second vessel connected to the return line of the first vessel.

A final embodiment is given in FIG. 4. In this embodiment the feed line 10 of the second vessel 9, the feeding pot, connects to the return line of the first vessel 8, the melting pot. This set-up can not be used to change the composition of the deposited coating, while continuing the coating process and controlling the coating composition at the same time. In this case all the valves have to be closed, the melts replaced and then the valves opened up again, first valves V1 and V2, then valve V3.

The invention claimed is:

1. A method to control the composition of a liquid metal in an evaporator device in a vacuum chamber, wherein the liquid metal comprises two or more metals, the method comprising the steps of supplying a liquid metal of a first composition comprising a first weight percent of a first metal and a second weight percent of a second metal in a first vessel, supplying a liquid metal of a second composition comprising a third weight percent of the first metal and a fourth weight percent of the second metal in a second vessel, feeding liquid metal comprising the first metal and the second metal to an evaporator by:
(a) feeding the liquid metal of the second composition to the liquid metal of the first vessel upstream of the evaporator to form a combined stream and feeding the combined stream to the evaporator, or
(b) feeding the liquid metal of the first composition directly to the evaporator and feeding the liquid metal of the second composition directly to the evaporator, discharging an evaporated stream of metal evaporated from the liquid metal in the evaporator, the evaporated stream of metal comprising a fifth weight percent of the first metal and a sixth weight percent of the second metal, the fifth weight percent and sixth weight percent being predetermined respective target amounts of the first and second metal;

wherein the first metal in the evaporator has a different vapor pressure than the second metal in the evaporator, wherein the first composition corresponds to the composition of liquid metal in the evaporator to form the evaporated stream with the predetermined target amounts of the two metals, wherein the second composition of the liquid metal in the second vessel is chosen to control the composition of the liquid metal in the evaporator and compensate for the evaporation of the metals from the evaporator, wherein the second composition of the liquid metal in the second vessel corresponds to the predetermined vapour composition of the evaporated stream and differs from the composition of the liquid metal in the evaporator.

2. The method according to claim 1,
wherein the liquid metal of the first composition is fed from the first vessel to the evaporator through a supply line,
wherein the liquid metal in the evaporator returns from the evaporator to the first vessel through a return line, and
wherein the liquid metal of the second composition is fed through a feed line from the second vessel to the liquid metal of the first vessel or to the evaporator.

3. The method according to claim 2, wherein the supply line is provided with a magnetohydrodynamic pump.

4. The method according to claim 2, wherein the return line is provided with a magnetohydrodynamic pump.

5. The method according to claim 2, wherein the feed line is provided with a magnetohydrodynamic pump.

6. The method according to claim 2, wherein the feed line of the second vessel connects to the supply line of the first vessel.

7. The method according to claim 2, wherein level sensors are provided for the first and second vessel and for the evaporator.

8. The method according to claim 2, wherein flow meters are provided in both the feed line and the return line.

9. The method according to claim 2, wherein valves are provided in the supply line, the feed line and the return line.

10. The method according to claim 2, wherein the evaporator is provided with an induction heater.

11. The method according to claim 2,
wherein each of the supply line, the feed line, the return line has a magnetohydrodynamic pump,
wherein each of the supply line, the feed line, the return line has a valve,
wherein heating means heat the supply line, the feed line, the return line, the valves, the magnetohydrodynamic pumps, and the first and second vessel.

12. The method according to claim 2, wherein the feed line of the second vessel connects to the evaporator.

13. The method according to claim 2, wherein the feed line of the second vessel connects to the return line.

14. The method according to claim 1, wherein, while supply of the first composition of liquid metal in the first vessel is stopped and then liquid metal in the first vessel is changed to a predetermined composition, the composition of the liquid metal in the second vessel is the second composition to facilitate a change of the evaporated stream from a first coating composition to a second coating composition.

15. The method according to claim 1, wherein the composition of the liquid metal in the second vessel corresponds to the predetermined vapour composition and with an amount corresponding to vaporization rate of the evaporated metal.

16. The method according to claim 1, wherein prior to changing the first composition of liquid metal in the first vessel to a predetermined composition of liquid metal in the first vessel, the composition of the liquid metal in the second vessel is changed to correspond to the predetermined composition of liquid metal in the first vessel to facilitate a change of the evaporated stream from a first coating composition to a second coating composition.

17. The method according to claim 1, wherein the feeding of the liquid metal of the second composition is to the liquid metal of the first vessel.

18. The method according to claim 1, wherein the feeding of the liquid metal of the second composition is to the evaporator.

19. The method according to claim 18, wherein the feeding of the liquid metal of the second composition is directly to the evaporator.

20. The method according to claim 1, wherein the target composition of the evaporated stream has 2-10 wt. % Mg and a remainder of Zn; and the second composition has between 25% less than the wt % Mg of the target composition of the evaporated stream and 25% more than the target composition of the evaporated stream.

21. The method according to claim 1, wherein the target composition of the evaporated stream has 2-10 wt. % Mg and a remainder of Zn; and the second composition has between 25% less than the wt % Mg of the target composition of the evaporated stream and 10% more than the target composition of the evaporated stream.

22. The method according to claim 1, wherein the target composition of the evaporated stream has 30-50 wt. % said first metal; and the second composition has between 10% less than the wt. % said first metal of the target composition of the evaporated stream and 10% more than the wt. % said first metal of the target composition of the evaporated stream.

23. The method according to claim 1, wherein the target composition of the evaporated stream has 2-50 wt. % Mg; and the second composition has between 10% less than said wt. % Mg of the target composition of the evaporated stream and 10% more than said wt. % Mg of the target composition of the evaporated stream.

24. The method according to claim 1, wherein the evaporated stream composition is replenished such that the composition of the liquid metal in the evaporator stays constant.

* * * * *